US012577100B2

(12) United States Patent
Kim et al.

(10) Patent No.: US 12,577,100 B2
(45) Date of Patent: Mar. 17, 2026

(54) METHOD OF LIQUID-MEDIATED PATTERN TRANSFER AND DEVICE STRUCTURE FORMED BY LIQUID-MEDIATED PATTERN TRANSFER

(71) Applicant: The Board of Trustees of the University of Illinois, Urbana, IL (US)

(72) Inventors: Seok Kim, Pohang-si (KR); Jun Kyu Park, Portland, OR (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 645 days.

(21) Appl. No.: 17/990,902

(22) Filed: Nov. 21, 2022

(65) Prior Publication Data

US 2023/0166965 A1     Jun. 1, 2023

Related U.S. Application Data

(60) Provisional application No. 63/282,107, filed on Nov. 22, 2021.

(51) Int. Cl.
B81C 1/00          (2006.01)

(52) U.S. Cl.
CPC .. B81C 1/00158 (2013.01); *B81C 2201/0133* (2013.01); *B81C 2201/0194* (2013.01)

(58) Field of Classification Search
CPC ........ B81C 1/00158; B81C 2201/0133; B81C 2201/0194; H01L 2221/68354; H01L 2221/68368; H01L 21/6835; H01L 21/7806

USPC ......................................................... 247/415
See application file for complete search history.

(56) References Cited

U.S. PATENT DOCUMENTS

| | | | |
|---|---|---|---|
| 6,365,429 B1 * | 4/2002 | Kneissl | ................. H01S 5/4031 |
| | | | 438/455 |
| 7,943,491 B2 | 5/2011 | Nuzzo et al. | |
| 8,690,295 B2 * | 4/2014 | Bengali | .................. B41J 2/1631 |
| | | | 347/47 |
| 8,710,717 B2 * | 4/2014 | Dausch | .................. H10N 30/06 |
| | | | 310/334 |
| 10,017,867 B2 * | 7/2018 | Gesing | .............. C04B 35/58071 |
| 10,069,274 B2 * | 9/2018 | Liang | ........................ H01S 5/22 |

(Continued)

OTHER PUBLICATIONS

Altissimo, M. (2010). E-beam lithography for micro/nanofabrication. *Biomicrofluidics*, 4(2), 026503-1 to 026503-6.

(Continued)

*Primary Examiner* — Vu A Vu
(74) *Attorney, Agent, or Firm* — Crowell & Moring LLP

(57)          ABSTRACT

A method of liquid-mediated pattern transfer includes providing a substrate comprising (a) a semiconductor film adhered to the substrate and (b) a first patterned layer on the semiconductor film. The substrate is submerged in a delamination liquid, whereby the semiconductor film is delaminated from the substrate while the first patterned layer remains on the semiconductor film. A patterned semiconductor membrane ready for transfer is thus obtained. The patterned semiconductor membrane is transferred to a target substrate in a transfer liquid, and then the transfer liquid is removed (e.g., evaporated). The patterned semiconductor membrane adheres to the target substrate as the transfer liquid is removed.

12 Claims, 10 Drawing Sheets

(56) References Cited

U.S. PATENT DOCUMENTS

| | | | | |
|---|---|---|---|---|
| 10,149,079 B2 * | 12/2018 | Zheng | | H04R 19/005 |
| 10,213,835 B2 * | 2/2019 | Gledhill | | E21B 10/567 |
| 10,239,748 B2 * | 3/2019 | Maggi | | B81C 1/00238 |
| 10,734,167 B2 * | 8/2020 | El-Kady | | H01G 11/86 |
| 11,758,816 B2 * | 9/2023 | Le Rhun | | H10N 30/073 |
| | | | | 29/25.35 |
| 11,864,465 B2 * | 1/2024 | Lagally | | B06B 1/0644 |
| 2008/0157235 A1 | 7/2008 | Rogers et al. | | |
| 2015/0352586 A1 | 12/2015 | Kim et al. | | |
| 2018/0100046 A1 | 4/2018 | Kim et al. | | |
| 2019/0006180 A1 | 1/2019 | Kim et al. | | |
| 2021/0034935 A1 * | 2/2021 | Ballandras | | G06K 19/0675 |
| 2022/0163883 A1 | 5/2022 | Kim et al. | | |

OTHER PUBLICATIONS

Arutinov, G., Smits, E. C., Albert, P., Lambert, P., & Mastrangeli, M. (2014). In-plane mode dynamics of capillary self-alignment. *Languir*, 30(43), 13092-13102.

Autumn, K., et. al. (2006). Frictional adhesion: a new angle on gecko attachment. *J. Experimental Biology*, 209, 3569-3579.

Balla, T., Spearing, S. M., & Monk A. (2008). An assessment of the process capabilities of nanoimprint lithography. *Journal of Physics D: Applied Physics*, 41(17), 1-11.

Bratton, D., Yang , D., Dai, J., & Ober, C. K. (2006). Recent progress in high resolution lithography. *Polymers for Advanced Technologies*, 17(2), 94-103.

Carlson, A., Bowen, A. M., Huang, Y., Nuzzo, R. G., & Rogers, J. A. (2012). Transfer printing techniques for materials assembly and micro/nanodevice fabrication. *Advanced Materials*, 24(39), 5284-5318.

Chen, L., Guo, Z., & Liu, W. (2017). Outmatching superhydrophobicity: bio-inspired re-entrant curvature for mighty superamphiphobicity in air. *Journal of Materials Chemistry A*, 5(28), 14480-14507.

Chen, Y. (2015). Nanofabrication by electron beam lithography and its applications: A review. *Microelectronics Engineering*, 135, 57-72.

Chen, Y., et al. (2018). Multifunctional Nanocracks in Silicon Nanomembranes by Notch-Assisted Transfer Printing. *ACS Applied Materials & Interfaces*, 10(30), 25644-25651.

Chen, Z. (2002). The fracture of brittle thin films on compliant substrates in flexible displays. *Engineering Fracture Mechanics*, 69, 597-603.

Du, K., Wathuthanthri, I., Liu, Y., Xu, W., & Choi, C. H. (2012). Wafer-scale pattern transfer of metal nanostructures on polydimethylsiloxane (PDMS) substrates via holographic nanopatterns. *ACS Applied Materials & Interfaces*, 4(10), 5505-5514.

Hauseux, P., Nguyen, T. T., Ambrosetti, A., Ruiz, K. S., Bordas, S. P., & Tkatchenko, A. (2020). From quantum to continuum mechanics in the delamination of atomically-thin layers from substrates. Nature Communications, 11(1), 1651, 1-8.

Jiang, D., Feng, X., Qu, B., Wang, Y., & Fang, D. (2012). Rate-dependent interaction between thin films and interfaces during micro/nanoscale transfer printing. *Soft Matter*, 8(2), 418-423.

Keum, H., Chung, H. J., & Kim, S. (2013). Electrical contact at the interface between silicon and transfer-printed gold films by eutectic joining. *ACS Applied Materials & Interfaces*, 5(13), 6061-6065.

Keum, H., et al. (2016). Microassembly of heterogeneous materials using transfer printing and thermal processing. *Scientific Reports*, 6(1), 29925,1-9.

Kim, S. (2019). Micro-LEGO for MEMS. *Micromachines*, 10(4), 267, 1-24.

Kooy, N., Mohamed, K., Pin, L. T., & Guan, O. S. (2014). A review of roll-to-roll nanoimprint lithography. *Nanoscale Research Letters*, 9(1), 1-13.

Li, H., Wu, J., Huang, X., Yin, Z., Liu, J., & Zhang, H. (2014). A universal, rapid method for clean transfer of nanostructures onto various substrates. *ACS Nano*, 8(7), 6563-6570.

Liao, D., He, M., & Qiu, H. (2019). High-performance icephobic droplet rebound surface with nanoscale doubly reentrant structure. *International Journal of Heat and Mass Transfer*, 133, 341-351.

Linghu, C., et al. (2018). Rapidly tunable and highly reversible bio-inspired dry adhesion for transfer printing in air and a vacuum, *Soft Matter*, 15, 30-37.

Linghu, C., Zhang, S., Wang, C., & Song, J. (2018). Transfer printing techniques for flexible and stretchable inorganic electronics. *npj Flexible Electronics*, 2(26), 1-14.

Liu, T. L., & Kim, C. J. C. (2014). Turning a surface superrepellent even to completely wetting liquids. *Science*, 346(6213), 1096-1100.

Loo, Y. L., Willett, R. L., Baldwin, K. W., & Rogers, J. A. (2002). Interfacial chemistries for nanoscale transfer printing. *Journal of the American Chemical Society*, 124(26), 7654-7655.

Mastrangeli, M., Zhou, Q., Sariola, V., & Lambert, P. (2017). Surface tension- driven self-alignment. *Soft Matter*, 13(2), 304-327.

Park, J. K., & Kim, S. (2019). Three-dimensionally structured flexible fog harvesting surfaces inspired by Namib Desert Beetles. *Micromachines*, 10(3), 201, 1-10.

Park, J. K., Eisenhaure, J. D., & Kim, S. (2019). Reversible underwater dry adhesion of a shape memory polymer. *Advanced Materials Interfaces*, 6(3), 1801542-1 to 1801542-8.

Park, J. K., Yang, Z., & Kim, S. (2017). Black silicon/elastomer composite surface with switchable wettability and adhesion between lotus and rose petal effects by mechanical strain. *ACS Applied Materials & Interfaces*, 9(38), 33333-33340.

Pimpin, A., & Srituravanich, W. (2012). Review on micro-and nanolithography techniques and their applications. *Engineering Journal*, 16(1), 37-56.

Seidpourazar, R. et. al. (2012). Laser-Driven Micro Transfer Placement of Prefabrication Microstructures. *J. Microelectromechanical Systems*, 21(5), 1049-1058.

Schift, H. (2015). Nanoimprint lithography: 2D or not 2D? A review. *Applied Physics A*, 121(2), 415-435.

Seo, D. et al. (2018). Rates of cavity filling by liquids. *Proceedings of the National Academy of Sciences (PNAS)*, 115(32), 8070-8075.

Tas, N., Sonnenberg, T., Jansen, H., Legtenberg, R. & Elwenspoek, M. (1996). Stiction in surface micromachining. *Journaling of Micromechanics and Microengineering*, 6(4), 385.

Tseng, A. A., Chen, K., Chen, C. D., & Ma, K. J. (2003). Electron beam lithography in nanoscale fabrication: recent development. *IEEE Transactions on Electronics Packaging Manufacturing*, 26(2), 141-149.

Wang, Q., Chen, W., & Wu, J. (2019). Effect of capillary bridges on the interfacial adhesion of wearable electronics to epidermis. *International Journal of Solids and Structures*, 174-175, 85-97.

Wie, D. S. et al. (2018). Wafer-recyclable, environment-friendly transfer printing for large-scale thin-film nanoelectronics. Proceedings of the National Academy of Sciences (PNAS), 115(31), E7236-E7244.

Wu, S. ((1971). Calculation of interfacial tension in polymer systems. *Journal of Polymer Science: Part C*, 34(1), 19-30.

Wu, B., & Kumar, A. (2007). Extreme ultraviolet lithography: A review. *Journal of Vacuum Science & Technology B: Microelectronics and Nanometer Structures Processing, Measurement, and Phenomena*, 25(6), 1743-1761.

Xu, B., et al. (2016). An epidermal stimulation and sensing platform for sensorimotor prosthetic control, management of lower back exertion, and electrical muscle activation. *Advanced Materials*, 28(22), 4462-4471.

Yang, Z., Park, J. K., & Kim, S. (2018). Magnetically responsive elastomer-silicon hybrid surfaces for fluid and light manipulation. *Small*, 14(2), 1702839-1 to 1702839-9.

Yeom, J., & Shannon, M. A. (2010). Detrachment Lithography of Photosensitive Polymers: A Route to Fabricating Three-Dimensional Structures. *Advanced Functional Materials*, 20(2), 289-295.

Yin, M., et al. (2019). 3D printed microheater sensor-integrated, drug-encapsulated microneedle patch system for pain management. *Advanced Healthcare Materials*, 8(23), 1901170-1 to 1901170-10.

Yoo, B., et. al. (2014). Elastomeric Angled Microflaps with Reversible Adhesion for Transfer-Printing Semiconductor Membranes onto Dry Surfaces. *ACS Appl. Mater. Interfaces*, 6, 19247-19253.

(56) References Cited

OTHER PUBLICATIONS

Yoo, D., Johnson, T. W., Cherukulappurath, S., Norris, D. J., & Oh, S. H. (2015). Template-stripped tunable plasmonic devices on stretchable and rollable substrates. *ACS Nano*, 9(11), 10647-10654.

Zhang, X. C., (2008). Multiple film cracking in film/substrate systems with mismatch strainand applied strain. *J. Appl. Phys.*, 104, 063520-1 to 063520-8.

Zhang, Y., Kim, B., Gao, Y., Wie, D. S., Lee, C. H., & Xu, B. (2019). Chemomechanics of transfer printing of thin film in a liquid environment. *International Journal of Solids and Structures*, 180, 30-44.

Zhang, Y., Liu, Q., & Xu, B. (2017). Liquid-assisted, etching-free, mechanical peeling of 2D materials. *Extreme Mechanics Letters*, 16, 33-40.

Zhang, Y., Yin, M., Baek, Y., Lee, K., Zangari, G., Cai, L., & Xu, B. (2020). Capillary transfer of soft films. Proceedings of the National Academy of Sciences (PNAS), 117(10), 5210-5216.

* cited by examiner

Front side of Si

Black Si

Silanized glass

Breakable leg

Au

Acetone

Back side of Si

Silanized glass

NdFeB

Acetone

METHOD OF LIQUID-MEDIATED PATTERN TRANSFER AND DEVICE STRUCTURE FORMED BY LIQUID-MEDIATED PATTERN TRANSFER

RELATED APPLICATION

The present patent document claims the benefit of priority to U.S. Provisional Patent Application No. 63/282,107, which was filed on Nov. 22, 2021, and is hereby incorporated by reference in its entirety.

FEDERALLY SPONSORED RESEARCH OR DEVELOPMENT

This invention was made with government support under ECCS-1950009 awarded by the National Science Foundation. The government has certain rights in the invention.

TECHNICAL FIELD

The present disclosure is related generally to pattern transfer technology and more particularly to a liquid-mediated pattern transfer method suitable for large-area films and membranes.

BACKGROUND

Pattern transfer on a substrate is essential for integrating nano-to-microscale materials into functional structures and devices for a wide scope of applications. For example, lithographical pattern transfer (e.g. photolithography, e-beam lithography, imprinting lithography, etc.) that forms a photoresist pattern on a substrate has been ubiquitously utilized in top-down monolithic microfabrication together with successive process steps (e.g., etching and deposition). However, it suffers from the process specific drawbacks, such as the requirement of a flat substrate and limited material compatibility.

Alternatively, direct pattern transfer via transfer printing and contact transfer is relatively free from those challenges since it generates a pattern on a target substrate by conveying formerly patterned materials that are produced on a separate mother substrate. To date, these methods to transfer patterned materials on one substrate to another have been done by direct contact with a target substrate or by a polymeric mediator that is often either a spin-coated layer or a reversible dry adhesive. In many cases, patterned materials formed on a mother substrate after undercutting a sacrificial layer underneath are transferred to a target substrate by one of these approaches. In the case of transfer printing, patterned materials together with a polymeric mediator are peeled off from a mother substrate and placed onto a target substrate. Then the removal of the polymeric mediator finishes the transfer of patterned materials to the target substrate. Although this type of direct pattern transfer has been a powerful protocol to deterministically assemble nano-to-microscale materials onto target substrates, the entire pattern size of a transferred material may be limited, particularly for device-grade crystalline materials (e.g. Si, GaAs, GaN, etc.), which may be highly rigid and brittle. A thin large-area brittle material may be prone to fracture during transfer due to strain mismatch with a target substrate or polymeric mediator. Thus, direct pattern transfer of a large-area, device-grade material without physical damage is a significant challenge.

BRIEF SUMMARY

Described herein is a method of liquid-mediated pattern transfer and a device structure formed by liquid-mediated pattern transfer.

The method includes providing a substrate comprising (a) a semiconductor film adhered to the substrate and (b) a first patterned layer on the semiconductor film. The substrate is submerged in a delamination liquid, and the semiconductor film is delaminated from the substrate while the first patterned layer remains on the semiconductor film. A patterned semiconductor membrane ready for transfer is thus obtained. The patterned semiconductor membrane is transferred to a target substrate in a transfer liquid, and then the transfer liquid is removed (e.g., evaporated). The patterned semiconductor membrane adheres to the target substrate as the transfer liquid is removed.

The device structure includes a patterned semiconductor membrane comprising a semiconductor film, a first patterned layer on a front side of the semiconductor film, and a second patterned layer on a back side of the semiconductor film.

DETAILED DESCRIPTION

Direct transfer of pre-patterned device-grade nano-to-microscale materials may be applicable to many high performance, heterogeneously integrated functional systems that would otherwise require conventional lithography-based microfabrication. Described in this disclosure is a self-delamination-driven pattern transfer method for large-area device-grade materials via well-controlled interfacial design in liquid media. In one implementation, using an intermediate or mediator substrate, the pattern transfer method allows for patterning both front and back sides of a semiconductor membrane to enable multifunctional device capabilities. The liquid-mediated pattern transfer technology may be used in a broad variety of applications, such as electronics, microelectromechanical systems, wetting and filtration, and metamaterials.

Figures 1A, 1B, 1C:
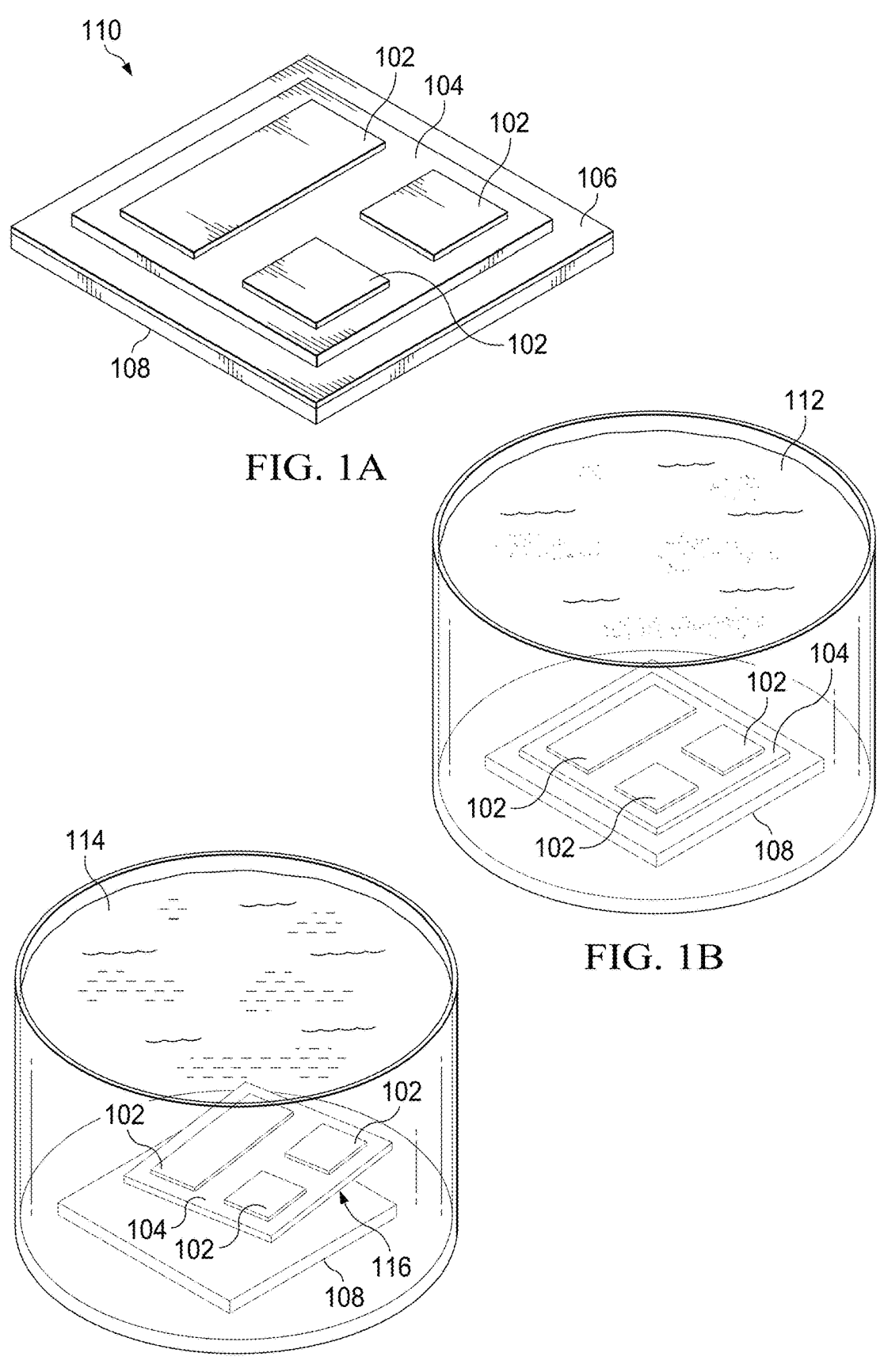
FIGS. 1A-1C illustrate an exemplary process in which a semiconductor film is delaminated from a substrate in a delamination liquid to form a patterned semiconductor membrane, which is ready for transfer to another substrate; prior to delamination, a patterned layer is formed on the semiconductor film.
Figure 10:
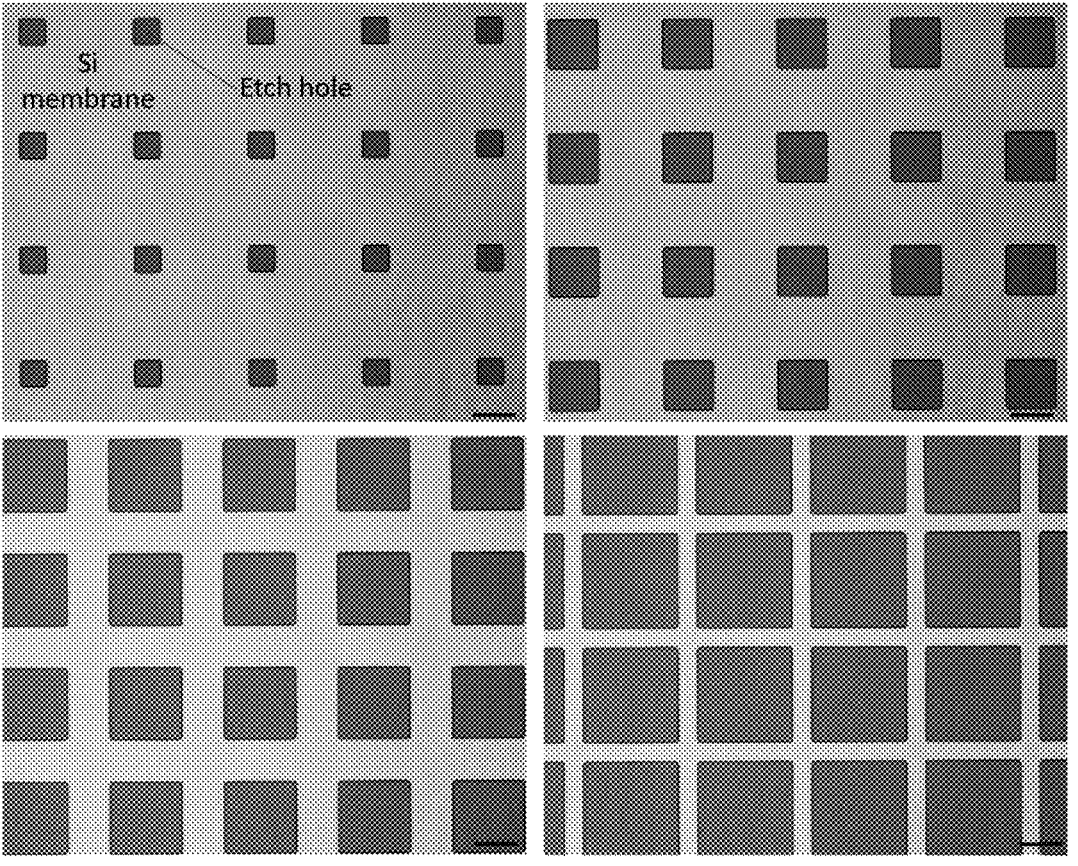
FIG. 10 shows optical images of silicon films with different porosity (through-thickness holes), 0.04 (left top image), 0.2 (right top image), 0.4 (left bottom image), 0.7 (right bottom image), where the scale bars indicate 100 µm.

The pattern transfer method is described in reference to FIGS. 1A-4D. Referring first to FIG. 1A, the method may include forming a first patterned layer 102 on a silicon film 104 of a silicon-on-insulator substrate 110, which includes a silicon substrate 108, a silicon dioxide layer 106 on the silicon substrate 108, and the silicon film 104 on the silicon dioxide layer 106. The first patterned layer 102 may be formed using film deposition, lithography, and etching processes known in the art. After forming the first patterned layer 102, the silicon-on-insulator substrate 110 is submerged in an etchant solution 112 comprising hydrofluoric acid. This leads to selective etching and removal of the silicon dioxide (or "sacrificial") layer 106, such that the silicon film 104, which is not etched by hydrofluoric acid, is adhered the silicon substrate 108, as illustrated in FIG. 1B. During etching and removal of the silicon dioxide layer 106, the first patterned layer 102, which comprises a material (e.g., a metal) resistant to etching by hydrofluoric acid, remains on the silicon layer 104. To facilitate complete etching of the silicon dioxide layer 106, the silicon film 104 may include through-thickness holes for flow of the etchant solution 112 to the underlying silicon dioxide layer 106. FIG. 10 shows examples of silicon films 104 including through-thickness holes, which may be produced by etching the silicon film 104 prior to forming the first patterned layer 102. The silicon film 104 may comprise single crystalline silicon and may be described as a device layer. The first patterned layer 102 may comprise a noble metal (e.g., gold) or a transition metal, for example, which is not etched by hydrofluoric acid.

Referring now to FIG. 1C, the silicon substrate 108 is submerged in a delamination liquid 114, which may comprise acetone or water in some examples. The silicon film 104 and/or the first patterned layer 102 may also be submerged in the delamination liquid 114. During the submersion, the silicon film 104 is delaminated from the silicon substrate 108, assuming the delamination liquid 114 is properly selected, as explained below, while the first patterned layer 102 remains on the silicon film 104. Thus, the silicon film 104 with the first patterned layer 102 thereon is separated from the substrate 108, and a freestanding patterned silicon membrane 116 is obtained, as illustrated in FIG. 1C. The delamination process may take place under ambient conditions, e.g., at room temperature (20-25° C.) and atmospheric pressure.

The delamination process described in reference to FIG. 1C is not limited to silicon (Si) films (or silicon substrates), and may be more broadly applicable to other types of semiconductor films, such as gallium arsenide (GaAs) films, gallium nitride (GaN) films, and, more generally speaking, to any Group IV, Group III-V, or Group II-VI semiconductor film, as well as to other growth substrates. Accordingly, throughout this disclosure, the term "patterned semiconductor membrane" may be used in place of "patterned silicon membrane," the term "semiconductor film" may be used in place of "silicon film," and/or the term "substrate" may be used in place of "silicon substrate." The semiconductor films may be single crystalline semiconductor films and may be alternatively described as device layers.

After delamination from the substrate 108, the patterned semiconductor membrane 116 may undergo liquid-mediated transfer to a target substrate 120 for further processing, device assembly, and/or usage, as described below in reference to FIGS. 2A-2B and 3A-3C. In some examples, prior to transfer to the target substrate 120 for use, an optional transfer to a mediator substrate 118 may occur for further processing of the patterned semiconductor membrane 116, as described below in reference to FIGS. 4A-4D. The mediator substrate 118 may be silanized or coated with an anti-stick monolayer (e.g., a silane monolayer) to promote moderate adhesion to the patterned semiconductor membrane 116, instead of the strong adhesion desired between the patterned semiconductor membrane 116 and the target substrate 120. Advantageously, the transfer of the patterned semiconductor membrane 116 to the mediator and/or target substrates 118,120 takes place in a transfer liquid 122 to avoid contact with and/or damage to the patterned semiconductor membrane 116. The target substrate 120 and the optional mediator substrate 118 may be rigid or flexible. Suitable materials for either substrate 118,120 may comprise glass or a polymer, such as polydimethylsiloxane (PDMS), or another material.

Figure 2A:
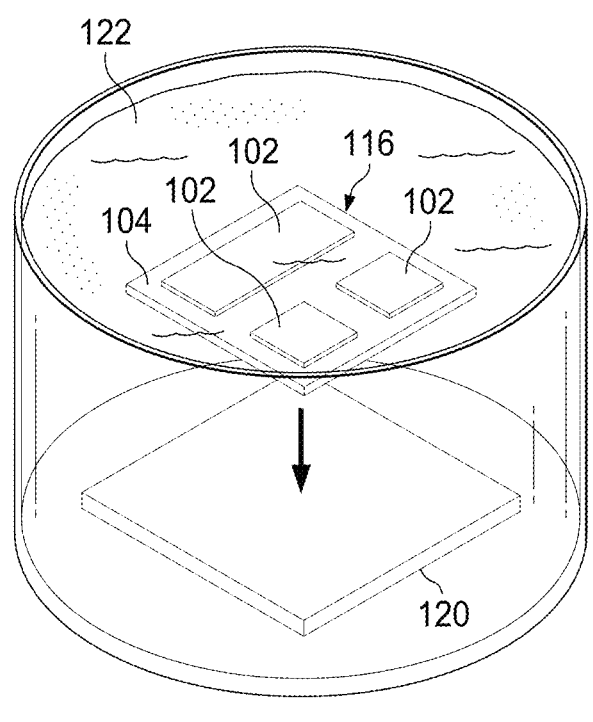
FIGS. 2A-2B show transfer of the patterned semiconductor membrane to a target substrate in a transfer liquid (FIG. 2A) for further processing (FIG. 2B).

FIG. 2A illustrates transfer of the patterned semiconductor membrane 116 to a target substrate 120 for, in this example, further processing prior to usage on the substrate 120. As indicated above, transfer of the patterned semiconductor membrane 116 to the target substrate 120 takes place in a transfer liquid 122, and then the transfer liquid 122 is removed (e.g., drained away and/or evaporated). The patterned semiconductor membrane 116 adheres to the target substrate 120 as the transfer liquid 122 evaporates or is otherwise removed. Removal of liquid between two surfaces (the membrane 116 and the target substrate 120 in this case) can produce a surface tension-induced pressure that leads to tight contact between the surfaces. This surface tension-induced pressure may be represented by $\Delta P = \gamma_l (\cos \theta_{tl} + \cos \theta_{sl})/h$, where h represents the distance between the semiconductor membrane 116 and the target substrate 120, $\gamma_l$ represents the surface tension of the liquid 122, and $\theta_{tl}$ and $\theta_{sl}$ represent the contact angle of the liquid 122 on the membrane 116 and the substrate 120, respectively. In some examples, the target substrate 120 may include a hydrophilic region (e.g., defined by a silane pattern, which is hydrophobic) thereon that promotes alignment of the patterned semiconductor membrane 116 on the substrate 120 as the transfer liquid 122 is removed. Typically, the transfer liquid 122 comprises acetone or water. The transfer liquid 122 may be the same as or different from the delamination liquid 114.

Figure 2B:
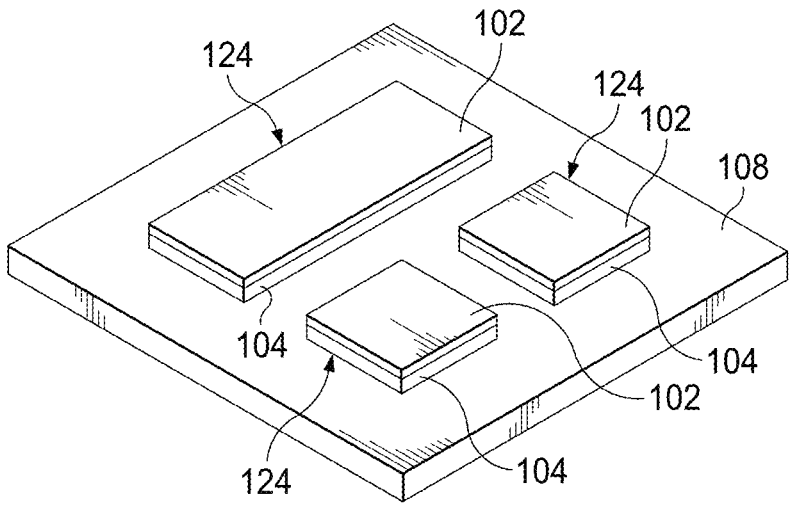
Figure 5:
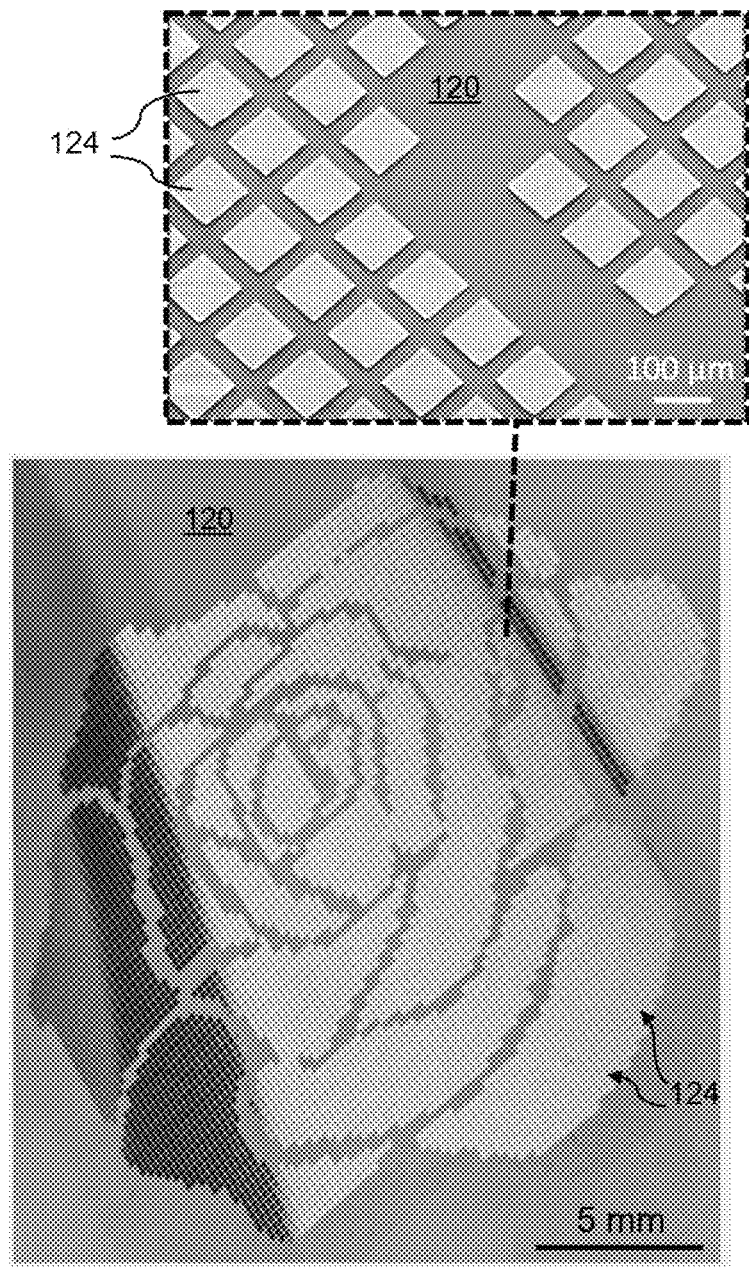
FIG. 5 shows an arrangement of dual-layer Au/Si platelets that yields a rose mosaic structure on a flexible target substrate, which in this example is polydimethylsiloxane (PDMS).

Referring now to FIG. 2B, after the removal of the transfer liquid 122, the patterned semiconductor membrane 116 may undergo further processing. For example, the semiconductor film 104 may be etched (e.g., with reactive ion etching (RIE)) using the first patterned layer as a hard mask to form a desired device structure, as shown here. In this example, a plurality of dual-layer platelets 124 comprising the first patterned layer (e.g., gold) 102 and unetched portions of the semiconductor film 104 are created. FIG. 5 illustrates how an arrangement of such dual-layer platelets 124 (see inset) can be used to form a desired structure on a rigid or flexible (as shown in FIG. 5) target substrate 120.

Figures 3A, 3B, 3C:
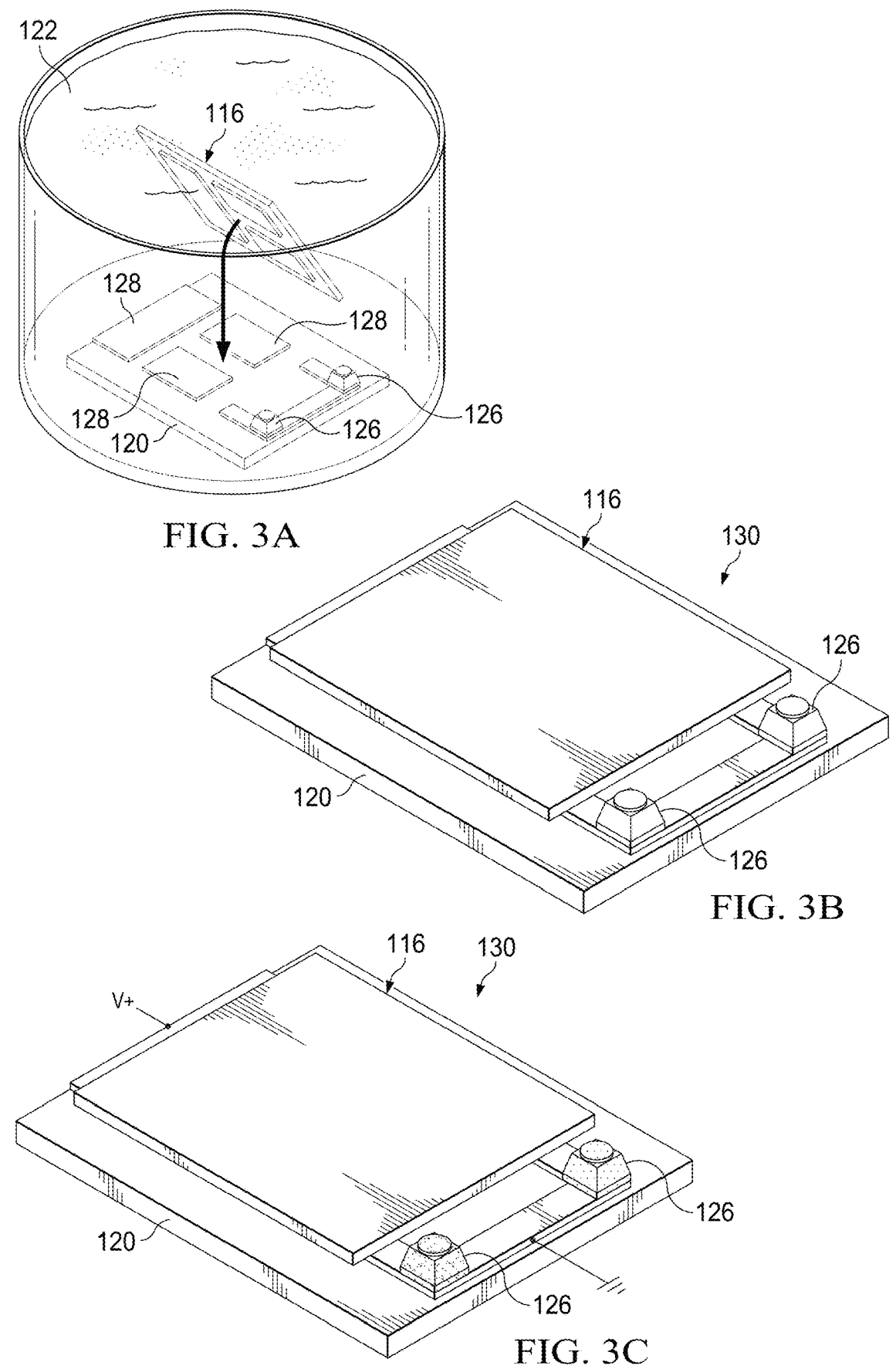
FIGS. 3A-3C show transfer of the patterned semiconductor membrane to a target substrate (FIG. 3A) for assembly with one or more other components (FIG. 3B) and use in an optoelectronic system (FIG. 3C).

In the transfer example of FIGS. 3A to 3C, the patterned semiconductor membrane 116 may be used directly on the target substrate 120 with no further processing, and/or may be assembled with one or more other components 126,128 to form a desired device structure 130. In this example, the target substrate 120 includes disconnected light emitting diodes (LEDs). After assembly of the device structure 130, as shown in FIG. 3B, the electric circuit is connected and the LEDs are turned on with an external power supply, as illustrated in FIG. 3C.

As can be seen by comparing FIG. 2A and FIG. 3A, the patterned semiconductor membrane 116 may be transferred to the target substrate 120 patterned side up (FIG. 2A) or patterned side down (FIG. 3A). As described above, transfer of the patterned semiconductor membrane 116 to the target substrate 120 takes place in a transfer liquid 122, and then the transfer liquid 122 is removed (e.g., drained away and/or evaporated), such that the patterned semiconductor membrane 116 adheres to the target substrate 120. In some examples, the target substrate 120 may include a hydrophilic region thereon that promotes alignment of the patterned semiconductor membrane 116 on the target substrate 120 as the transfer liquid 122 evaporates or is otherwise removed.

Figures 4A, 4B, 4C:
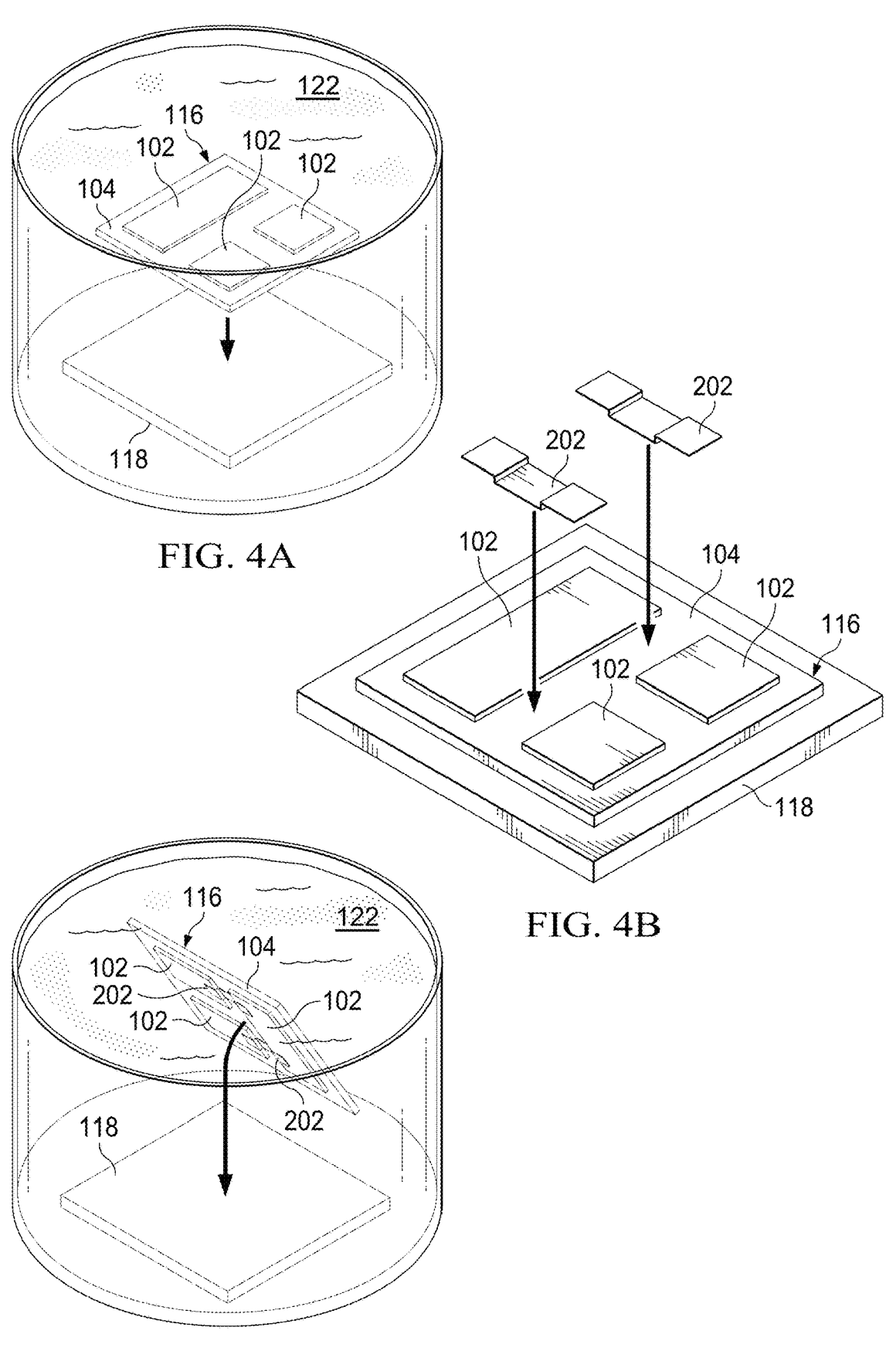
FIGS. 4A-4F show transfer of the patterned semiconductor membrane to an intermediate or mediator substrate (FIG. 4A) for front-side patterning (FIG. 4B), followed by flipping over and transfer to the same or a different mediator substrate (FIG. 4C) for back-side patterning (FIG. 4D), followed by delamination of the patterned semiconductor membrane (FIG. 4E) and transfer to a target substrate for use (FIG. 4F).

In another example, as illustrated in FIGS. 4A to 4F, prior to transferring the patterned semiconductor membrane 116 to the target substrate 120 for use, the patterned semiconductor membrane 116 may be transferred to a mediator substrate 118 for further processing. As with the transfer to the target substrate 120, the transfer to the mediator substrate 118 may take place in a transfer liquid 122. Upon removal of the transfer liquid 122, e.g., by evaporation, the patterned semiconductor membrane 116 may adhere to the mediator substrate 118. In some examples, the mediator substrate 118 may comprise silanized glass or may be coated with an anti-stick monolayer as described above to promote moderate as opposed to strong adhesion. If alignment of the patterned semiconductor membrane 116 on the mediator substrate 118 is a concern, the mediator substrate 118 may include a hydrophilic region thereon to promote the desired alignment as the transfer liquid 122 evaporates. The patterned semiconductor membrane 116 may be transferred to the mediator substrate 118 patterned side up, as illustrated in FIG. 4A, or patterned side down. As shown in FIG. 4B, while on the mediator substrate 118, the patterned semiconductor membrane 116 may be processed to include a second patterned layer 202 on the patterned semiconductor membrane 116. As with the first patterned layer 102, the second patterned layer 202 may be formed using film deposition, lithography, and etching processes known in the art. However, in contrast to formation of the first patterned layer 102, the second patterned layer 202 need not be resistant to hydrofluoric acid (HF) since there is no further exposure to an etching solution including HF. Accordingly, the second patterned layer 202 may comprise a material that is not resistant to hydrofluoric acid, such as a transition metal or other non-noble metal. In this example, the second patterned layer 202 is deposited on the front side of the semiconductor film 104 (since the patterned semiconductor membrane 116 was transferred to the mediator substrate 118 patterned side up); however, it is alternatively possible for the second patterned layer 202 to be deposited on the back side of the semiconductor film 104, e.g., when the patterned semiconductor membrane 116 is transferred to the mediator substrate 118 patterned side down.

After forming the second patterned layer 202, the patterned semiconductor membrane 116 may be submerged in a delamination liquid 114, as illustrated for example in FIG. 1C, such that the patterned semiconductor membrane 116 is delaminated from the mediator substrate 118 while the first and second patterned layers 102,202 remain on the patterned semiconductor membrane 116. After delamination from the mediator substrate 118, the membrane 116 including the first and second patterned layers 102,202 may be transferred to a target substrate 120 as described above.

Figures 4D, 4E, 4F:
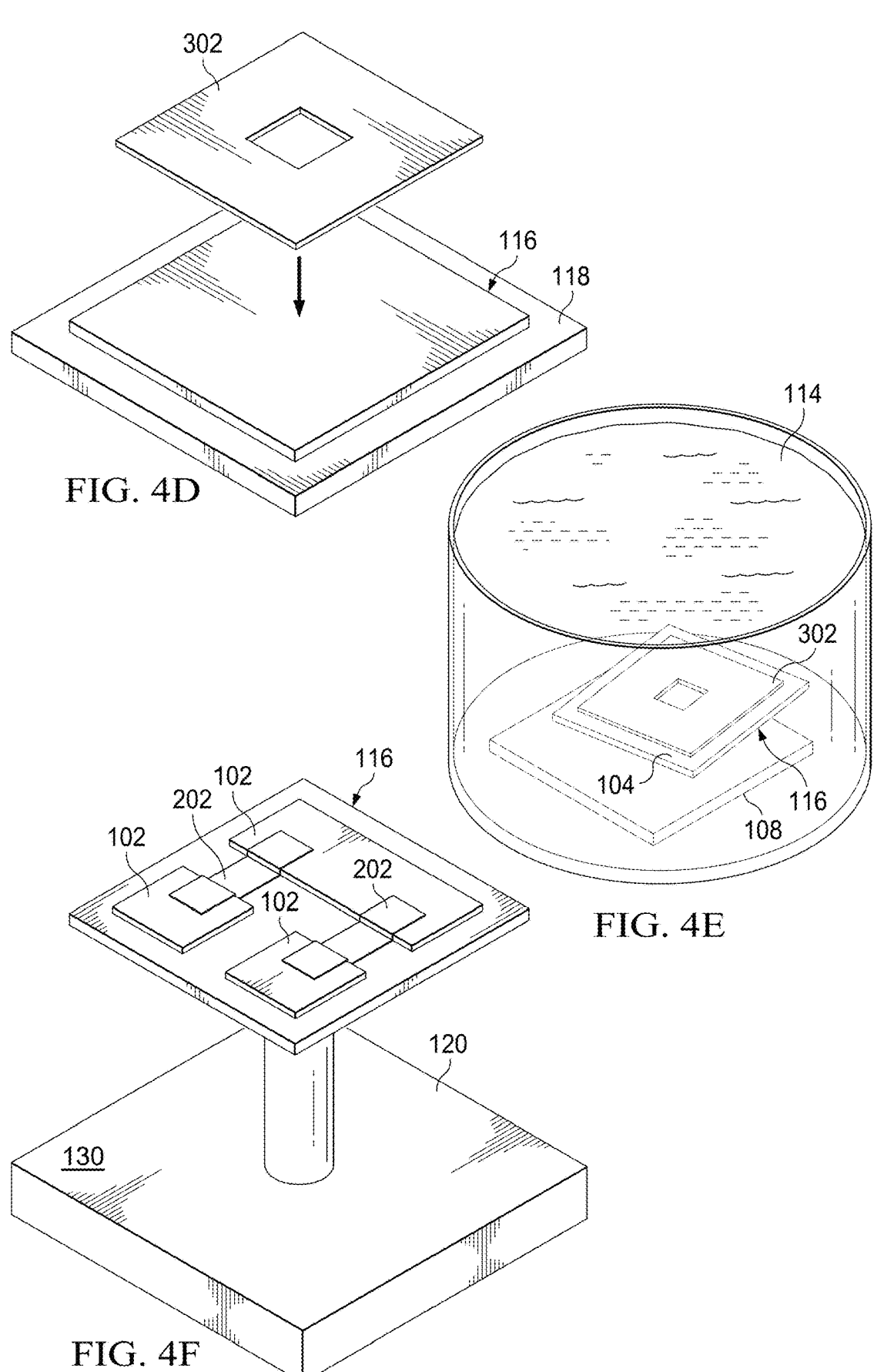

Alternatively, as shown in FIG. 4C, after delamination, the patterned semiconductor membrane 116 may be flipped over and redeposited on the (same or a different) mediator substrate 118 for further processing on the other side. In this example, after flipping over, the patterned semiconductor membrane 116 is deposited patterned side down (FIG. 4C), since the patterned semiconductor membrane 116 was initially deposited patterned side up (FIG. 4A). The redepositing takes place in the transfer liquid 122 (which may be the same as the delamination liquid 114), and, as the transfer liquid 122 is removed, the semiconductor membrane 116 is adhered to the mediator substrate 118. After redepositing the patterned semiconductor membrane 116 on the mediator substrate 118 and removing the transfer liquid 122, a third patterned layer 302 may be formed on the patterned semiconductor membrane 116, as illustrated in FIG. 4D, using deposition, lithography and etching methods known in the art. Like the second patterned layer 202, the third patterned layer need not be resistant to HF. Accordingly, the third patterned layer 302 may comprise a material that is not resistant to HF, such as a transition metal or other non-noble metal. After forming the third patterned layer 302, the patterned semiconductor membrane 116 may be submerged in the delamination liquid 114, as shown in FIG. 4E, such that the patterned semiconductor membrane 116 is delaminated from the mediator substrate 118 while the first, second and third patterned layers 102,202,302 remain on the patterned semiconductor membrane 116. Finally, after delamination from the mediator substrate 118, the patterned semiconductor membrane 116 may be transferred to the target substrate 120 for use, as described above, and as shown in FIG. 4F. The liquid-mediated transfer process described according to various examples in this disclosure may take place under ambient conditions, e.g., at room temperature (20-25° C.) and atmospheric pressure.

As illustrated in FIGS. 4A-4F and described above, the pattern transfer method allows a patterned semiconductor membrane 116 to be attached to and detached from a mediator substrate 118 several times in a transfer liquid 122, which provides a powerful route to multiple microfabrication processes of a semiconductor membrane. Since the mediator substrate 118 needs no sacrificial layer (e.g., the silicon dioxide layer 106 described above), there is no process constraint caused by using a sacrificial layer. For example, making a patterned silicon membrane directly from an SOI substrate does not allow depositing any materials incompatible with HF due to its use to remove the silicon dioxide (sacrificial) layer after patterning, and that limitation may be avoided here. As described above in reference to FIG. 4B, the patterned semiconductor membrane 116 is readily flipped in the transfer liquid 122 and can remain patterned side down on the mediator substrate 118. Therefore, both front and back sides of the patterned semiconductor membrane 116 can be processed and patterned to have multiple functions. This capability is exceptional since conventional semiconductor membrane preparation protocols allow for sophisticated patterning steps on only the front side of the semiconductor membrane 116, which can limit device functionality and performance.

Accordingly, a device structure 130 formed by the delamination and transfer method may uniquely include a dual-side patterned semiconductor membrane 116; that is, the patterned semiconductor membrane 116 may comprise a semiconductor film 104 with a first patterned layer 102 on a front side of the semiconductor film 104 and a second (or third) patterned layer 202,302 on a back side of the semiconductor film, as illustrated in the liquid-mediated transfer example of FIGS. 4A-4F. The patterned semiconductor membrane 116, the semiconductor film 104, and the patterned layers 102, 202,302 may include any of the characteristics, features, and/or properties described above or elsewhere in this disclosure. For example, the semiconductor film 104 may include an array of through-thickness holes. The device structure 130 may form part or all of an electronic system, an optoelectronic system, a microelectromechanical system, a re-entrant system, a wetting and filtration system, and/or a metamaterial system.

Figures 6A, 6B, 6C, 6D, 6E, 6F:
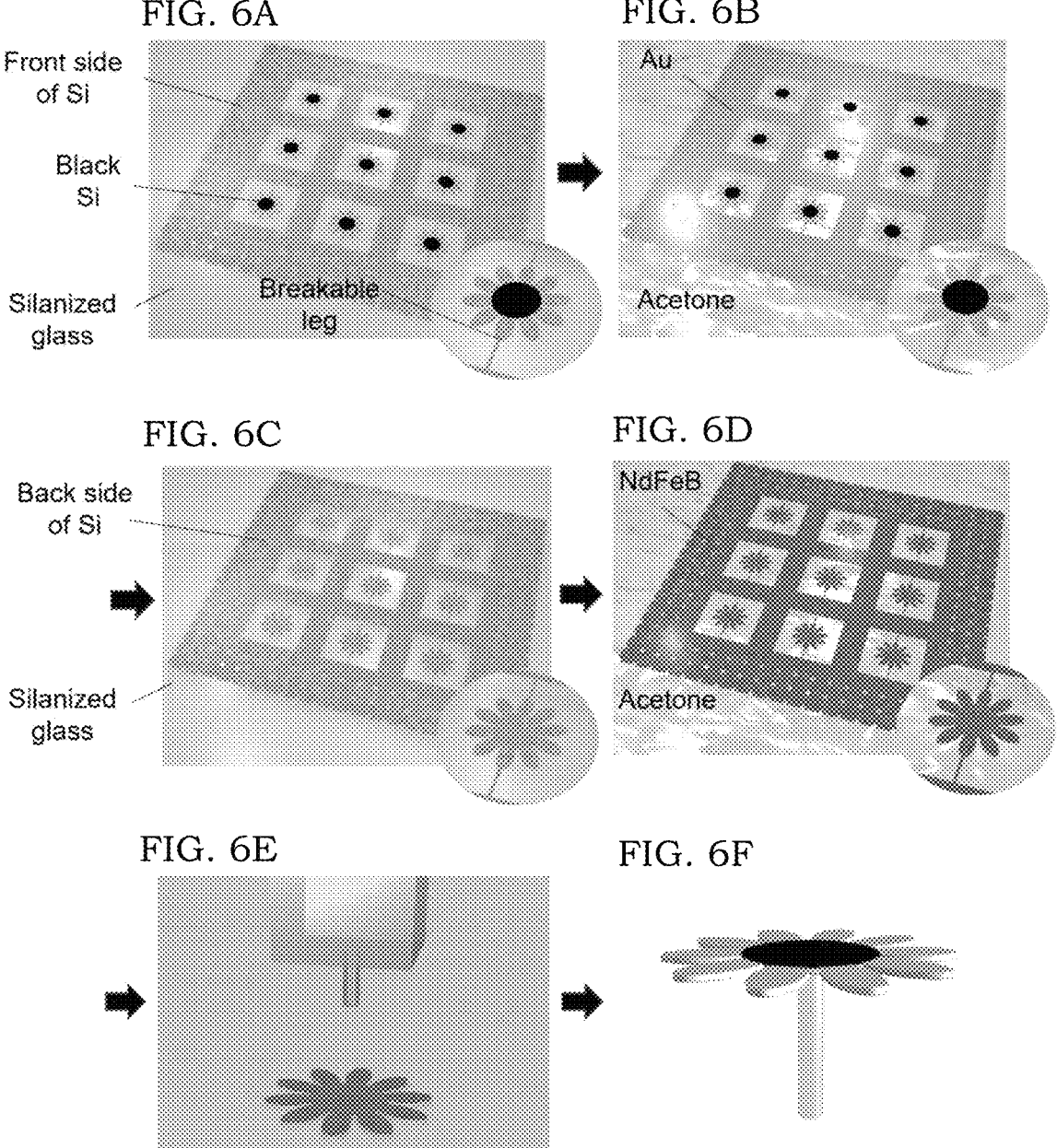
FIGS. 6A-6F show steps in a double-sided patterning and transfer process to form a multifunctional sunflower-mimicking structure from a patterned semiconductor membrane.

As an experimental demonstration of a transfer process including processing steps on both sides of a patterned semiconductor membrane 116, double-side patterned sunflower-like silicon platelets are fabricated as shown in FIGS. 6A-6F. On the front side, black silicon and thin gold surfaces are patterned to mimic a sunflower using structural coloration and material color. On the back side, a NdFeB hard magnet material is deposited and magnetized in one direction. Then one of the double-side patterned silicon platelets is retrieved and assembled on top of a flexible PDMS pillar, which finishes the fabrication of a sunflower-like structure with dual functionalities. In more detail, the process steps include, referring first to FIG. 6A, transferring a silicon membrane with a sunflower-shape black silicon pattern to a silane-coated glass substrate. In FIG. 6B, a gold layer is patterned on the silicon membrane, which is then delaminated and floated in an acetone bath. In FIG. 6C, the silicon membrane is transferred onto a new silanized glass substrate for backside processing. In FIG. 6D, a neodymium iron boron (NdFeB) magnetic alloy is sputtered onto the back side, and then the silicon membrane is delaminated from the substrate and is floated in acetone bath. In FIG. 6E, the silicon membrane is transferred onto another new silanized glass substrate. After magnetization, one of the silicon platelets that is mechanically tethered from the silicon membrane is picked up by a PDMS pillar. FIG. 6F shows the final fabricated sunflower mimicking structure. The scale bars in the schematics indicate 300 μm.

Due to the structural coloration, the center portion of the silicon platelet is deep black. Thanks to the strong magnetization in a NdFeB layer on the back side of the silicon platelet, the assembled structure can be actuated by an external magnetic field. Implementing both the structural coloration by black silicon and the magnetic motion by a NdFeB layer on only one side would be impossible if the patterning were limited to the front side of the silicon membrane only. As demonstrated here, double-sided processing of a silicon membrane allows two incompatible functionalities to be achieved in a single structure without compromising any performance.

The delamination and transfer method described in this disclosure can be successfully employed with large-area, device quality films, which are difficult to transfer without damage using other methods. For example, the semiconductor film 104 and patterned semiconductor membrane 116 obtained from the delamination process may have an area of up to or larger than 1 cm², up to or larger than 12 cm², and/or up to or larger than 20 cm². In some examples, the area may be as large as about 26 cm². The thickness of the semiconductor film 104 typically lies in a range from about 1 micron to about 100 microns.

Figure 7:
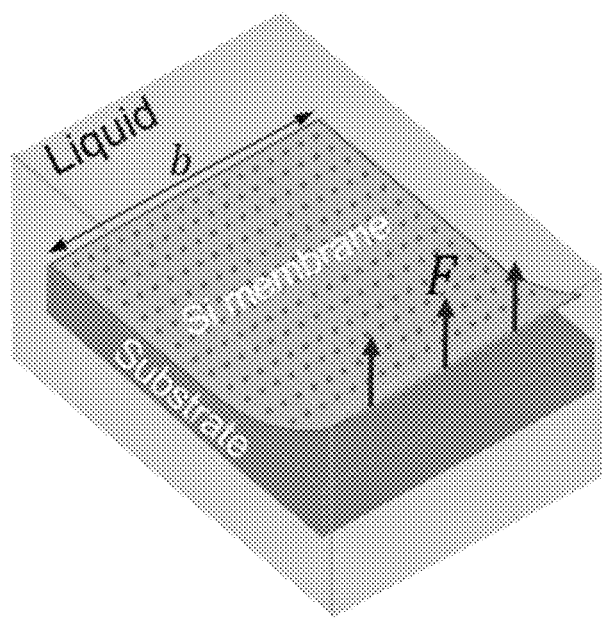
FIG. 7 is a schematic illustration of a mechanics model of peeling a semiconductor film with an array of microscale holes and width b from a substrate in a liquid by a peeling force F at a 90° degree peeling angle.

The mechanics of this pattern transfer method involve the deterministic self-delamination of a semiconductor film (e.g., a silicon film) from a mother or mediator substrate via controlled interfacial force. A silicon film (or membrane) is modeled as a thin film with width of b peeled off from a substrate by a peeling force F at a 90° peeling angle in a liquid environment, as illustrated in FIG. 7. For a quasi-static peeling process, with a small peeling distance $\Delta l$ in the direction of peeling force F, the energy balance between the work done by peeling force $\Delta W^F$ and the change of associated surface energy $\Delta E_{surface}$ at the steady state transfer leads to $W^F = \Delta E_{surface} = F\Delta l$. When a porous film with porosity $\rho$ delaminates from a substrate in liquid, the change of effective contact area is $\Delta l(1-\rho)b$. Therefore, the change of surface energy is $\Delta E_{surface} = (G_{ts} - \gamma_l(\cos \theta_{tl} + \cos \theta_{sl}))\Delta l(1-\rho)$ b, where $\gamma_l$ is liquid surface tension, $\theta_{tl}$ and $\theta_{sl}$ are the contact angle of liquid on thin film and substrate, respectively, and reflects their surface wettability. $G_{ts}$ is the interfacial adhesion energy between thin film and substrate in a dry air condition, and $G_{ts} = \gamma_t + \gamma_s - \gamma_{ts}$ where $\gamma_t$ and $\gamma_s$ are the surface tension of thin film and substrate, respectively, and $\gamma_{ts}$ is the interfacial tension between thin film and substrate. With $W^F = \Delta E_{surface} = F\Delta l$, the peeling force per unit width is now written as:

$$F/b = (G_{ts} - \gamma_l(\cos \theta_{tl} + \cos \theta_{sl}))(1-\rho). \tag{1}$$

Figure 8:
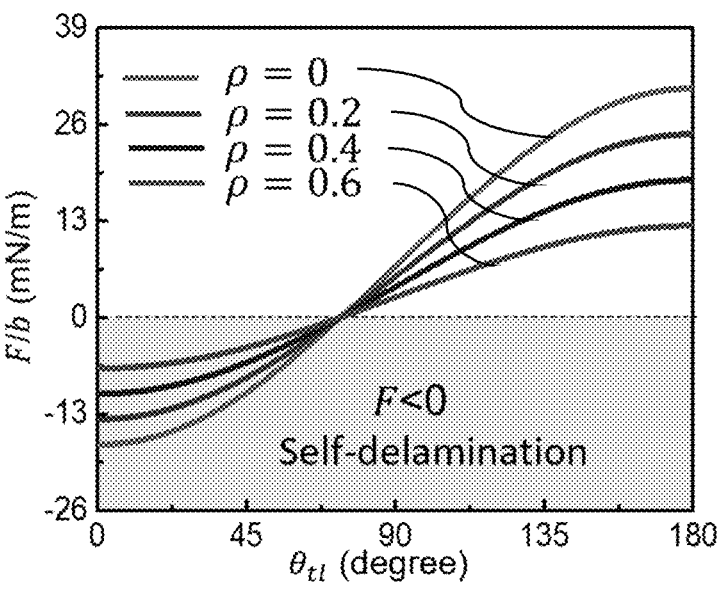
FIG. 8 shows theoretical calculations of peeling force per unit width F/b as a function of thin film surface wettability $\theta_{tl}$ for films with different $\rho$ (total holes area over total film area), where $G_{ts}$=29.4 mN/m, $\theta_{sl}$=20°, and $\gamma_l$=24 mN/m.

When the required peeling force per unit width $F/b \leq 0$, Equation (1) shows that a film is self-delaminated from a substrate in liquid, and at $F/b > 0$, applying an external force F becomes necessary for achieving the self-delamination. FIG. 8 represents the plot of the required F/b along with the porosity and wettability of thin film when $G_{ts} = 29.4$ mN/m, $\theta_{sl} = 20°$, and $\gamma_l = 24$ mN/m. Similar figures have been obtained to show the effect of wettability of substrate and interfacial adhesion energy between thin film and substrate on the required F/b, respectively. The required peeling strength F/b increases with the increasing of interfacial adhesion energy $G_{ts}$ and F/b becomes larger than 0 for all the porosity of film when $G_{ts}$ is beyond a critical value such as the large van der Waals interaction force. In this scenario, applying an external mechanical peeling force is required to assist the delamination at the interface between film and substrate.

Figure 9:
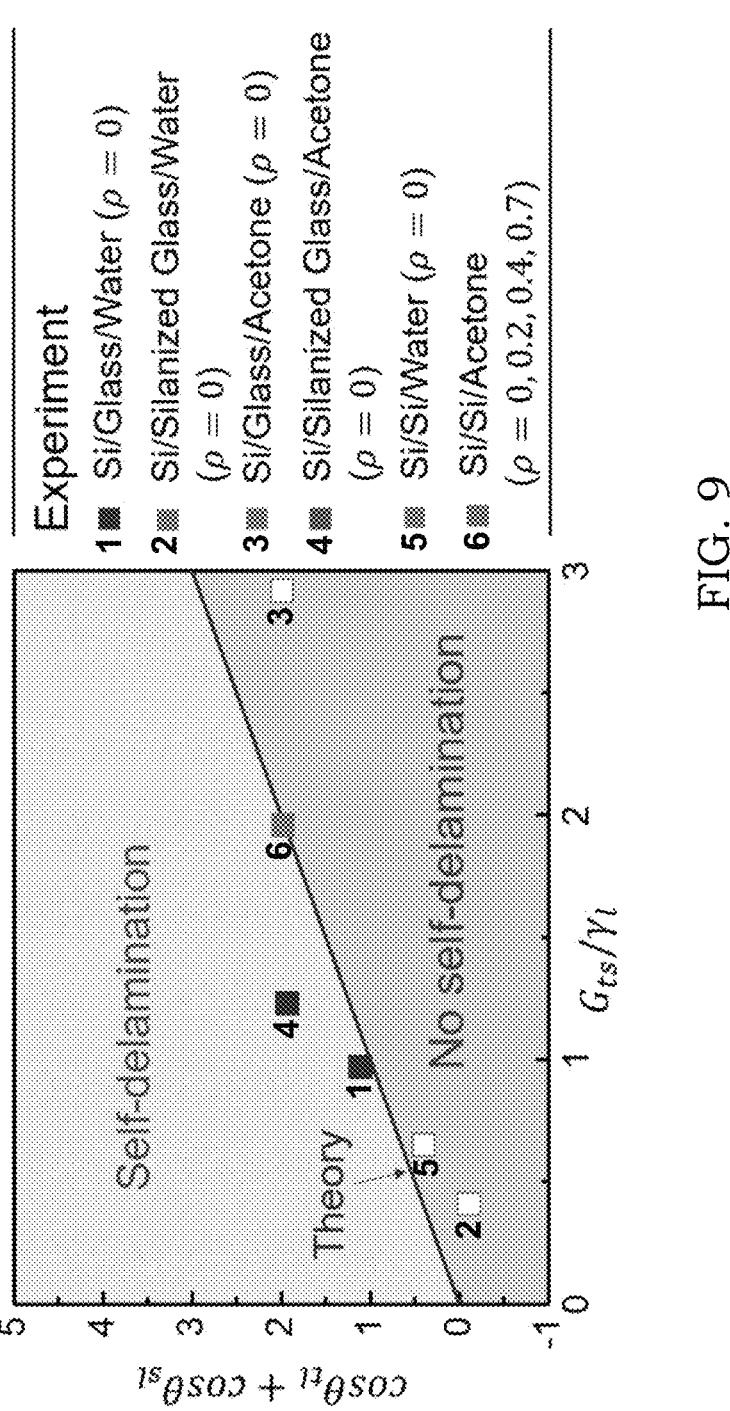
FIG. 9 shows a theoretical phase diagram illustrating successful conditions of thin film self-delamination, which are experimentally confirmed for a number of thin film/substrate/liquid combinations.

As indicated in Equation (1), a thin film is easily peeled off from a substrate in a liquid environment when the wettability is high, the film-substrate interfacial adhesion energy is low, or the porosity of a film is large. To prove this, various pairs of substrate and liquid for a silicon film are experimentally investigated and the favorable pairs for peeling are found. As shown in FIG. 9, the theoretical diagram calculated using Equation (1) with $\rho=0$ agrees well with the experiment results. In the theoretical diagram, the solid curve represents the theoretical prediction on critical condition of thin film self-delamination. The symbols represent the experimental results, where the open symbols denote no self-delamination and the solid symbols denote self-delamination. The various symbols define material types of film/ substrate/liquid as indicated in the legend. Table 1 provides the values of parameters (G, contact angle, surface tension) which are calculated using the harmonic mean equation.

TABLE 1

Values of G, contact angle, and surface tension for various
combinations of film, substrate, and liquid.

| | |
|---|---|
| Si/Si (HF treated) with water | $G_{ts} = 47.3$ mN/m, $\gamma_l = 72$ mN/m and $\theta_{tl} = \theta_{sl} = 78.5°$ |
| Si/Si (HF treated) with acetone | $G_{ts} = 47.3$ mN/m, $\gamma_l = 24$ mN/m and $\theta_{tl} = \theta_{sl} = 7.65°$ |
| (HF treated) Si/Glass with acetone | $G_{ts} = 70.2$ mN/m, $\gamma_l = 24$ mN/m and $\theta_{tl} = 5.750$ $\theta_{sl} = 5.75°$ |
| (HF treated) Si/Glass with water | $G_{ts} = 70.2$ mN/m, $\gamma_l = 72$ mN/m and $\theta_{tl} = 78.85°$ $\theta_{sl} = 24.66°$ |
| (HF treated) Si/silanized glass with acetone | $G_{ts} = 29.4$ mN/m, $\gamma_l = 24$ mN/m, and $\theta_{tl} = 7.56°$ $\theta_{sl} = 20°$ |
| (HF treated) Si/silanized Glass with water | $G_{ts} = 29.4$ mN/m, $\gamma_l = 72$ mN/m, and $\theta_{tl} = 78.85°$ $\theta_{sl} = 107.72°$ |

Guided by the theoretical analysis in Equation (1) and the related experimental results, an acetone medium is selected to effectively peel a silicon film from a silicon mother substrate, and a silanized glass substrate is chosen as a mediator substrate for the examples described in this disclosure. In addition, the theoretically calculated effect of porosity on F/b is experimentally proven. Silicon films with different porosity (in the form of through-thickness holes) of 0.04, 0.2, 0.4, and 0.7 are prepared as shown in FIG. 10, and the experimental results qualitatively show that a higher porosity silicon film is more favorable for peeling off from a silicon substrate in an acetone medium. The computational modeling of the self-delamination of a film on substrates with a broad variety of materials is similar to that of peeling a film from substrates under an applied mechanical force where molecular dynamics (MD) simulations can be employed. Once the self-delaminated patterned semiconductor membrane is obtained, it can be readily implemented into other processes (as discussed above in reference to FIGS. 2A-4F) for fabricating integrated functional systems.

EXAMPLES

Fabrication and transfer of a patterned silicon membrane: Fabrication of a patterned silicon membrane starts with rinsing an SOI wafer (3 μm thick silicon film (device layer) and 1 μm thick $SiO_2$ sacrificial layer) with acetone, isopropyl alcohol (IPA), and deionized (DI) water followed by drying under a stream of nitrogen. Cr (5 nm)/Au (50 nm) is deposited using e-beam evaporation (FC-2000, Termescal) onto the device layer of SOI wafer and wet etched through a mask of photoresist (AZ5214, Microchem). Then the silicon film is patterned into a desired shape using $SF_6$ (20 sccm) and $O_2$ (2 sccm) plasma at 150 W, 20 mTorr for 6 min. After that, the substrate is immersed in HF bath for 6-12 h to remove the $SiO_2$ sacrificial layer. The patterned silicon membrane is delaminated from the mother SOI substrate by immersing in acetone bath. Then the floating patterned silicon membrane is scooped with acetone and transferred onto a target substrate. Drying of underlying liquid completes the pattern transfer of the patterned silicon membrane which comprises a silicon film with a patterned layer thereon.

Preparation of hydrophilic region on target or mediator substrate: To pattern a hydrophilic region on a target substrate, a mask of photoresist is patterned on the area and silane (Trichloro(1H,1H,2H,2H,-perfluorooctyl)silane, Sigma Aldrich) is selectively deposited using the photoresist as a masking layer. The target substrate is cleaned with acetone and IPA to remove the masking layer. Then the patterned silicon membrane, which comprises a Si film with a Au/Cr pattern thereon, is flipped inside the acetone bath and moved to a DI water bath. After that, the patterned silicon membrane is transferred onto the hydrophilic region comprising the silane with the DI water. Drying takes place for up to 24 hours to ensure tight contact is made between the patterned silicon membrane and the target substrate.

Fabrication of a double-side patterned structure: The device layer (silicon film) of an SOI wafer (10 μm thick device layer and 1 μm thick $SiO_2$ sacrificial layer) is partially patterned with black silicon nanostructures. To pattern black silicon nanostructures, native oxide on Si surface is removed in HF bath for 1 minute. Then a thin oxide layer is grown by $O_2$ plasma at 10 sccm, RF1 120 W, RF2 200 W at 50 mTorr for 5 minutes. The oxide layer is incompletely etched by $CHF_3$ plasma at 12 sccm, 350 W at 50 mTorr for 2 minutes. Using the left oxide islands as an etching mask, Si is slowly etched by $Cl_2$ (40 sccm) and Ar (4 sccm) plasma RF1 250 W, RF2 300 W at 90 mTorr for 10 minutes to form sharp and dense nanostructures. Then the Si membrane is patterned by DRIE process such that a silicon platelet array is mechanically supported. Then the patterned silicon membrane is delaminated and flipped from the mother substrate inside the liquid medium, and transferred on a silanized glass substrate. On the glass substrate, Cr (5 nm)/Au (50 nm) is patterned by a lift-off process with a photoresist masking layer (SPR220, Microchem). Once the front side process is finished, the patterned silicon membrane is delaminated again in an acetone bath and transferred to a new silanized glass substrate for backside processing. On the patterned silicon membrane, Ti (10 nm)/NdFeB (400 nm)/Ti (10 nm) are sputter deposited. After the deposition, the NdFeB layer is magnetized under 1.9 T magnetic field and delaminated from the glass substrate. After transfer to another new silanized glass substrate, a silicon platelet is mechanically untethered from the silicon membrane and picked up by a PDMS pillar to form a sunflower-mimicking structure.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of liquid-mediated pattern transfer, the method comprising:
providing a substrate including:
a semiconductor film adhered to the substrate; and
a first patterned layer on the semiconductor film;
submerging the substrate in a delamination liquid, whereby the semiconductor film is delaminated from the substrate while the first patterned layer remains on the semiconductor film, thereby obtaining a patterned semiconductor membrane ready for transfer;
transferring the patterned semiconductor membrane to a target substrate in a transfer liquid; and
removing the transfer liquid, the patterned semiconductor membrane adhering to the target substrate as the transfer liquid is removed, wherein the target substrate includes a hydrophilic region thereon, and wherein the hydrophilic region promotes alignment of the patterned silicon membrane on the target substrate as the transfer liquid is removed.

2. The method of claim 1, wherein the semiconductor film comprises a Group IV, Group III-V, or Group II-VI semiconductor film.

3. The method of claim 2, wherein the semiconductor film is a silicon film.

4. The method of claim 3, wherein the substrate comprises a silicon-on-insulator substrate including: the substrate; a silicon dioxide layer on the substrate; and the silicon film on the silicon dioxide layer, and further comprising, prior to submerging the substrate in the delamination liquid, submerging the silicon-on-insulator substrate in an etchant solution comprising hydrofluoric acid, thereby selectively etching the silicon dioxide layer and adhering the silicon film to the substrate, the first patterned layer remaining on the silicon film.

5. The method of claim 1, wherein the delamination liquid and the transfer liquid are selected from the group consisting of: acetone and water.

6. The method of claim 1, wherein the delamination liquid and the second transfer liquid are the same.

7. A method of liquid-mediated pattern transfer, the method comprising:

providing a substrate including:

a semiconductor film adhered to the substrate; and a first patterned layer on the semiconductor film;

submerging the substrate in a delamination liquid, whereby the semiconductor film is delaminated from the substrate while the first patterned layer remains on the semiconductor film, thereby obtaining a patterned semiconductor membrane ready for transfer;

transferring the patterned semiconductor membrane to a target substrate in a transfer liquid;

removing the transfer liquid, the patterned semiconductor membrane adhering to the target substrate as the transfer liquid is removed;

prior to transferring the patterned semiconductor membrane to the target substrate:

transferring the patterned semiconductor membrane to a mediator substrate for further processing, the transfer to the mediator substrate taking place in the transfer liquid, and removing the transfer liquid, the patterned semiconductor membrane adhering to the mediator substrate as the transfer liquid is removed; and after the transfer to the mediator substrate, forming a second patterned layer on the patterned semiconductor membrane.

8. The method of claim 7, wherein the patterned semiconductor membrane is transferred to the mediator substrate oriented patterned side up.

9. The method of claim 7, wherein the patterned semiconductor membrane is transferred to the mediator substrate oriented patterned side down.

10. The method of claim 7, further comprising, after forming the second patterned layer, submerging the patterned semiconductor membrane in the delamination liquid, whereby the patterned semiconductor membrane is delaminated from the mediator substrate while the first and second patterned layers remain on the patterned semiconductor membrane.

11. The method of claim 10, further comprising, after delaminating the patterned silicon membrane from the mediator substrate, flipping the patterned silicon membrane over, and redepositing the patterned silicon membrane on the mediator substrate, the redepositing taking place in the transfer liquid, and after the redepositing, removing the transfer liquid, the patterned semiconductor membrane adhering to the mediator substrate as the transfer liquid is removed.

12. The method of claim 11, further comprising, after removing the transfer liquid, forming a third patterned layer on the patterned semiconductor membrane.

* * * * *